(12) United States Patent
Tsou et al.

(10) Patent No.: US 7,208,835 B2
(45) Date of Patent: Apr. 24, 2007

(54) INTEGRATED CIRCUIT PACKAGE AND ASSEMBLY THEREOF

(75) Inventors: Yu-Jen Tsou, Huwei Township, Yunlin County (TW); Yi-Lung Fang, Sinpu Township, Hsinchu County (TW)

(73) Assignee: AU Optronics Corp., Hsinchu (TW)

( * ) Notice: Subject to any disclaimer, the term of this patent is extended or adjusted under 35 U.S.C. 154(b) by 156 days.

(21) Appl. No.: 11/073,447

(22) Filed: Mar. 7, 2005

(65) Prior Publication Data
US 2006/0108685 A1    May 25, 2006

(30) Foreign Application Priority Data
Nov. 22, 2004   (TW) ............... 93135847 A

(51) Int. Cl.
*H01L 23/48* (2006.01)
(52) U.S. Cl. ....................... 257/737; 257/738
(58) Field of Classification Search ............. 257/678, 257/737, 738
See application file for complete search history.

(56) References Cited

U.S. PATENT DOCUMENTS 5,487,999 A * 1/1996 Farnworth .................. 216/18
6,162,652 A * 12/2000 Dass et al. .................. 438/18
6,344,753 B1 * 2/2002 Takada et al. .............. 324/755
6,518,781 B2 * 2/2003 Masuda ...................... 324/757

FOREIGN PATENT DOCUMENTS

WO    WO2004001839    12/2003

* cited by examiner

*Primary Examiner*—Roy Potter
(74) *Attorney, Agent, or Firm*—Thomas, Kayden, Horstemeyer & Risley

(57) ABSTRACT

An integrated circuit (IC) package and IC assembly. The IC assembly comprises the IC package, an insulating substrate and an adhesive film. The IC package comprises a chip body and a plurality of bumps. The bumps are disposed on a first surface of the chip body, each bump having a patterned pressing surface. The insulating substrate comprises a plurality of electrode pads corresponding to the bumps. Each electrode pad has a second surface pressed on the pressing surface of each bump. The adhesive film is disposed between the IC package and the insulating substrate, for covering the bumps and the electrode pads.

13 Claims, 6 Drawing Sheets

INTEGRATED CIRCUIT PACKAGE AND ASSEMBLY THEREOF

BACKGROUND

The present invention relates to an Integrated Circuits (ICs) package and assembly thereof, and more particularly to an integrated circuits (ICs) package and assembly thereof utilizing chip-on-glass (COG) assembly without anisotropic conductive film (ACF).

Generally, a flat panel display, such as a liquid crystal displays (LCDs) or a plasma display panels (PDPs), utilizes a semiconductor element such as an IC chip to control image display thereon. Chip-on-glass (COG) structure is widely used in IC assembly, in which the driving IC chip is assembled directly on the insulating substrate of the flat panel display.

FIG. 1A and FIG. 1B show a conventional COG structure. As shown in FIG. 1A, a plurality of bumps 210 is disposed on the IC chip 20, and a plurality of electrode pads 110 corresponding to the bumps 210 is disposed on the insulating substrate 10. In assembly, a layer of ACF 30 which comprises conductive particles 310 is coated on the insulating substrate 10, and the IC chip 20 is pressed on the insulating substrate 10 as shown in FIG. 1B. The IC assembly is then placed under predetermined environmental pressure and temperature for a certain period of time so that the insulating substrate 10 and the IC chip 20 are adhered together by the ACF 30. Further, the bumps 210 on the IC chip 20 and the electrode pads 110 on the insulating substrate 10 are electrically connected respectively by the conductive particles 310 in the ACF 30. Generally, the bumps 210 are formed substantially identical size and height, and the pressing surfaces of the bumps 210 are formed as a flat surface to ensure the electrical connection between the bumps 210 and the electrode pads 110.

However, the conductive particles 310 may not be uniformly distributed in the ACF 30. It is possible that density of the conductive particles 310 in a certain area of the ACF 30 is relatively lower or higher. In either case, electrical connection in the IC assembly may be deteriorated.

FIG. 1C shows an example in which density of the conductive particles 310 in a certain area of the ACF 30 is relatively lower. In FIG. 1C, the area A between the bump 210 and the electrode pad 110 does not contain any conductive particles 310. Thus, a large resistance exists in the area A, and the bump 210 and the electrode pad 110 fail in the electrical connection.

On the other hand, FIG. 1D shows an example in which density of the conductive particles 310 in a certain area of the ACF 30 is relatively higher. In FIG. 1D, a large number of the conductive particles 310 accumulate in the area B between adjacent bumps 210, which leads to shorting in the area B.

Further, the ACF 30 is expensive due to addition of the conductive particles 310, the distance between the adjacent bumps 210 or the adjacent electrode pads 110 is limited by the size of the conductive particles 310 (for example, a diameter of 5 micrometers), and the density of the conductive lines is also limited. Additionally, the problem of the density of the conductive particles mentioned above brings large resistance and electrical connection failure by the reasons other than that shown in FIGS. 1C and 1D.

SUMMARY

Accordingly, an embodiment of the present invention discloses an IC chip. The IC package comprises a chip body with a first surface, a plurality of bumps disposed on the first surface, and each bump comprising a patterned pressing surface.

Another embodiment of the present invention discloses an IC assembly. The IC assembly comprises an IC chip, an insulating substrate, and an adhesive film. The IC chip comprises a chip body with a first surface and a plurality of bumps disposed on the first surface, each bump comprising a patterned pressing surface. The insulating substrate comprises a plurality of electrode pads corresponding to the bumps, and each electrode pad is disposed on a second surface of the insulating substrate. The adhesive film is disposed between the IC chip and the insulating substrate, and covers the bumps and the electrode pads. A plurality of conductive patterns is disposed on the patterned pressing surface or the electrode pad.

Still another embodiment of the present invention discloses an IC assembly. The IC assembly comprises an IC chip, an insulating substrate, and an adhesive film. The IC package comprises a chip body with a first surface and a plurality of bumps disposed on the first surface, each bump comprising a patterned pressing surface. The insulating substrate comprises a plurality of electrode pads corresponding to the bumps, and each electrode pad is disposed on a second surface of the insulating substrate. A plurality of first conductive patterns is formed on the patterned pressing surface, and a plurality of second conductive patterns is formed on the electrode pad. The adhesive film is disposed between the IC chip and the insulating substrate, and covers the bumps and the electrode pads.

Another embodiment of the present invention discloses a flat panel display. The flat panel display comprises an IC chip, a display panel, and an adhesive film. The IC chip comprises a chip body with a first surface and a plurality of bumps disposed on the first surface. The display panel comprises a plurality of electrode pads, and each electrode pad is disposed on a second surface of the insulating substrate. The adhesive film is disposed between the IC chip and the display panel, and covers the bumps and the electrode pads. A plurality of pattern is disposed on the patterned pressing surfaces or the electrode pad.

Further another embodiment of the present invention discloses a flat panel display. The flat panel display comprises an IC chip, a display panel, and an adhesive film. The IC chip comprises a chip body with a first surface and a plurality of bumps disposed on the first surface. The display panel comprises a plurality of electrode pads, and each electrode pad is disposed on a second surface of the insulating substrate. A plurality of first pattern is disposed on the patterned pressing surfaces, and a plurality of second pattern is disposed on the electrode pad. The adhesive film is disposed between the IC chip and the display panel, and covers the bumps and the electrode pads.

The first patterns and the second patterns are metal protrusions or recesses corresponding thereto, and is a substantially semi-sphere-shaped or other-shaped by easily to manufacture. The diameter of the substantially semi-sphere-shaped metal protrusions is in a range about 3 to about 15 micrometers.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

First Embodiment

The first embodiment of an IC chip is described hereinafter with reference to FIG. 2.

Figure 1A:
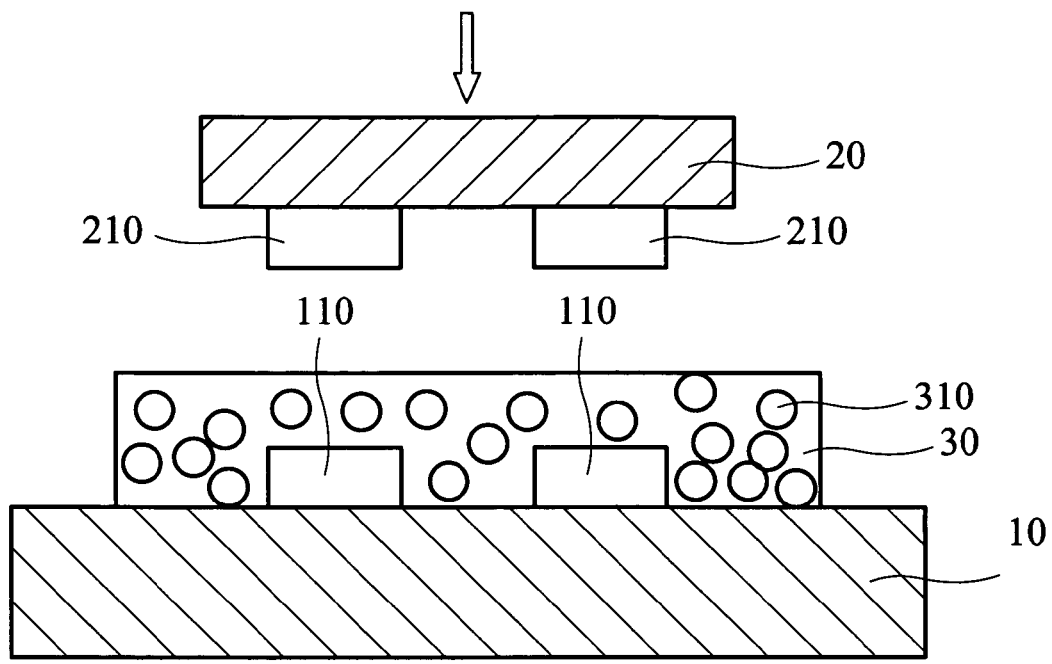
FIG. 1A is a schematic view of a conventional COG structure before assembly.
Figure 1B:
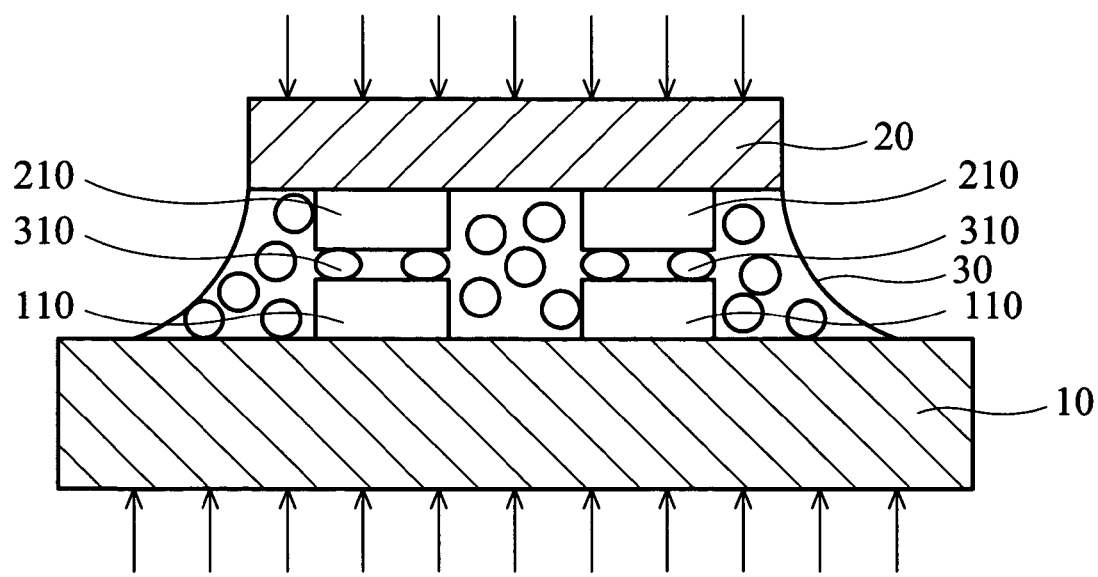
FIG. 1B is a schematic view of the conventional COG structure in the FIG. 1A in assembly.
Figure 1C:
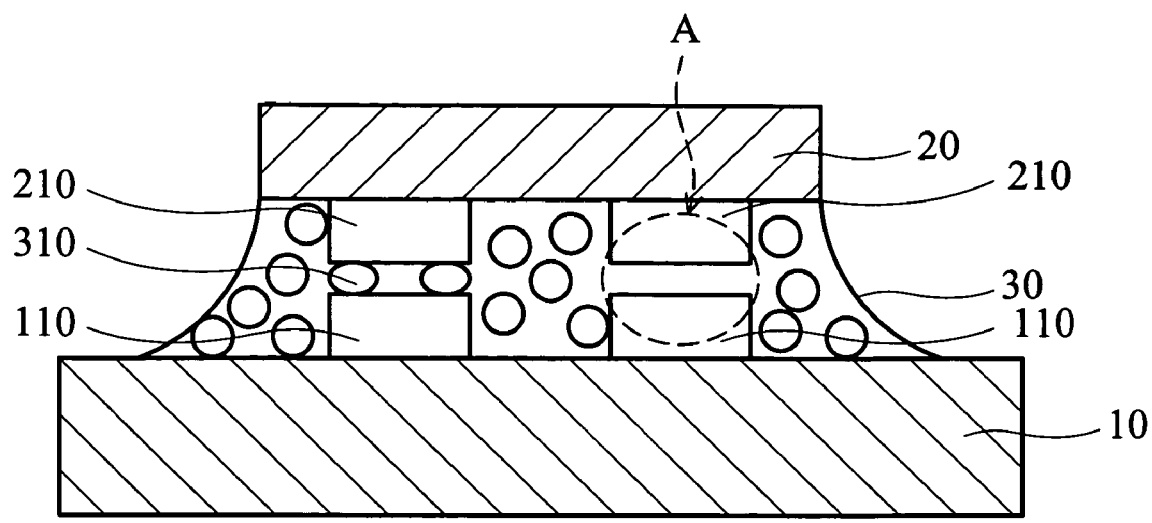
FIG. 1C is a schematic view of the conventional COG structure in the FIG. 1A in which electrical connection failure occurs.
Figure 1D:
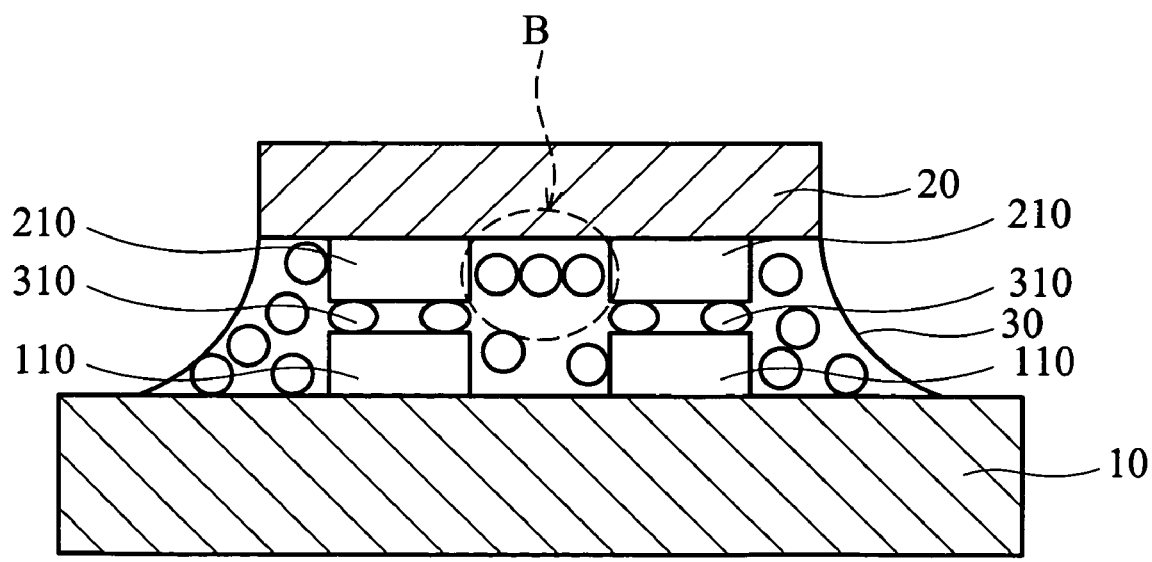
FIG. 1D is a schematic view of the conventional COG structure in the FIG. 1A in which short circuiting occurs.
Figure 2:
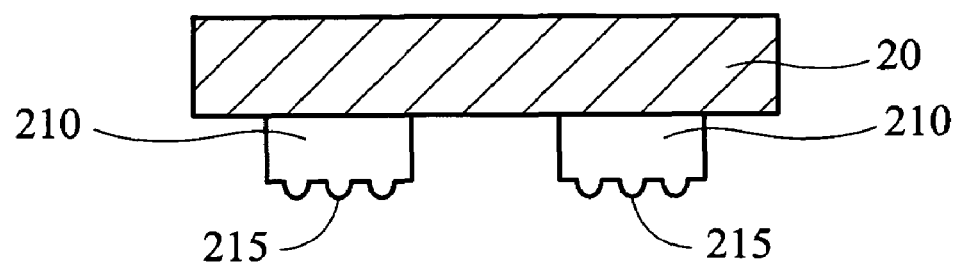
FIG. 2 is a schematic view of the first embodiment of the present invention of the IC chip.

In FIG. 2, the IC chip comprises a chip body (first substrate) 20 and a plurality of bumps 210. The chip body 20 is provided with a first surface, and the bumps 210 are disposed on the first surface. Each bump 210 comprises a patterned pressing surface with a plurality of substantially semi-sphere-shaped metal protrusions 215 disposed thereon as conductive patterns. Preferably, diameter of the metal protrusions 215 can be in a range about 3 to about 15 micrometer. Thus, the metal protrusions 215 can be utilized as medium of electrical connection of the bumps 210, similar to the conductive particles in the related art.

Second Embodiment

The second embodiment of an IC assembly is described hereinafter with reference to FIG. 3.

Figure 3:
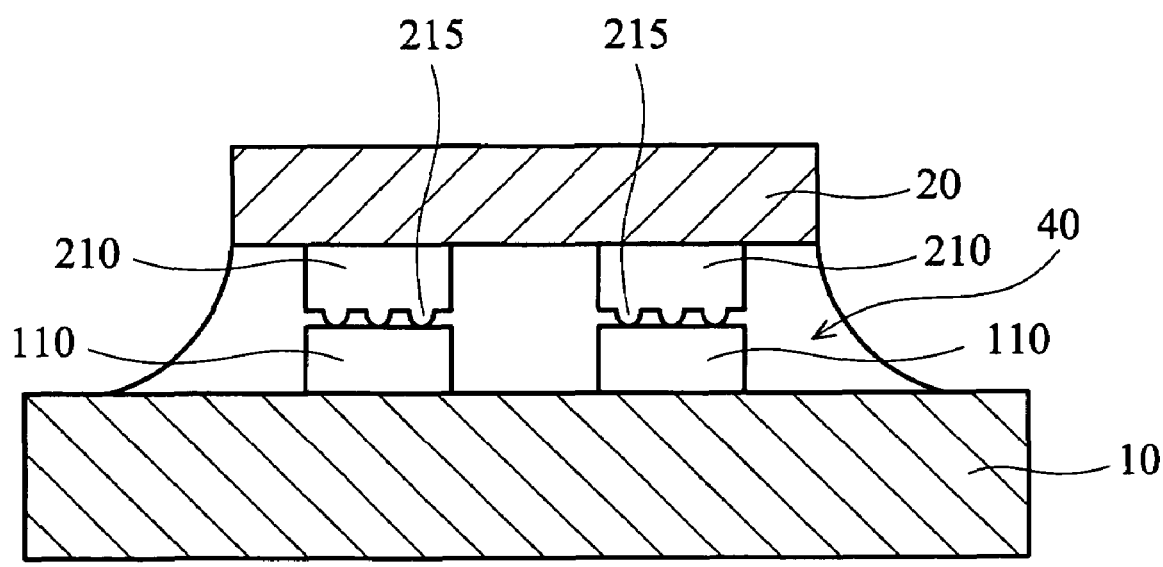
FIG. 3 is a schematic view of the second embodiment of the present invention of the IC assembly.

In FIG. 3, the IC assembly comprises an IC chip (first substrate) 20 as shown in FIG. 2, an insulating substrate (second substrate) 10 and an adhesive film 40. The IC chip 20 comprises a plurality of bumps 210, and each bump 210 comprises a patterned pressing surface with a plurality of substantially semi-sphere-shaped metal protrusions 215 disposed thereon as conductive patterns. The insulating substrate 10 comprises a glass or a plastic, comprises a plurality of electrode pads 110 corresponding to the bumps 210, and each electrode pad 110 is disposed on a second surface of the insulating substrate 10.

When each electrode pad 110 is pressed on the patterned pressing surface of each bump 210, the semi-sphere-shaped metal protrusions 215 on the patterned pressing surface electrically connected the bump 210 to the electrode pad 110. Thus, the bumps 210 and the electrode pads 110 are electrically connected to the metal protrusions 215.

Further, the adhesive film 40 is disposed between the IC chip 20 and the insulating substrate 10 for covering the bumps 210 and the electrode pads 110 and mounting the IC chips 20 and the insulating substrate 10. Instead of the ACF in the conventional COG structure, the adhesive film 40 can be an adhesive layer without conductive particles therein since electrical connection is established by the metal protrusions 215.

Third Embodiment

The third embodiment of an IC assembly is described hereinafter with reference to FIG. 4.

Figure 4:
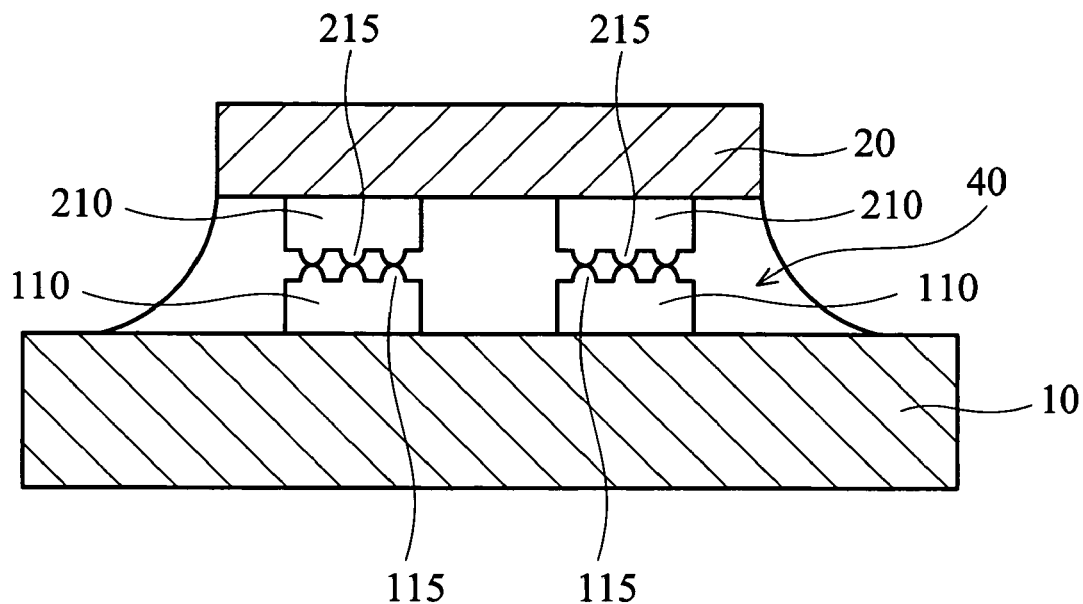
FIG. 4 is a schematic view of the third embodiment of the present invention of the IC assembly.

In FIG. 4, the IC assembly comprises an IC chip (first substrate) 20 as shown in FIG. 2, an insulating substrate (second substrate) 10 and an adhesive film 40. The IC chip 20 comprises a plurality of bumps 210, and each bump 210 comprises a patterned pressing surface with a plurality of semi-sphere-shaped metal protrusions 215 disposed thereon as first conductive patterns. The insulating substrate 10 comprises a glass or a plastic, comprises a plurality of electrode pads 110 corresponding to the bumps 210, and each electrode pad 110 disposed on a second surface of the insulating substrate 10 comprises a plurality of metal protrusions 115 disposed thereon as second conductive patterns. The metal protrusions 215 on the patterned pressing surface and the metal protrusions 115 on the electrode pad 110 are positioned straightly corresponding to each other.

When each electrode pad 110 is pressed on the patterned pressing surface of each bump 210, the metal protrusions 215 on the patterned pressing surface and the metal protrusions 115 on the electrode pad 110 are in direct contact and electrically connected the bump 210 to the electrode pad 110. Thus, the bumps 210 and the electrode pads 110 are electrically connected to the metal protrusions 115 and 215.

Further, the adhesive film 40 is disposed between the IC chip 20 and the insulating substrate 10 for covering the bumps 210 and the electrode pads 110 and mounting the IC chips 20 and the insulating substrate 10. Since electrical connection is established by the metal protrusions 115 and 215, the adhesive film 40 can be an adhesive layer without conductive particles therein.

Fourth Embodiment

The fourth embodiment of an IC assembly is described hereinafter with reference to FIG. 5.

Figure 5:
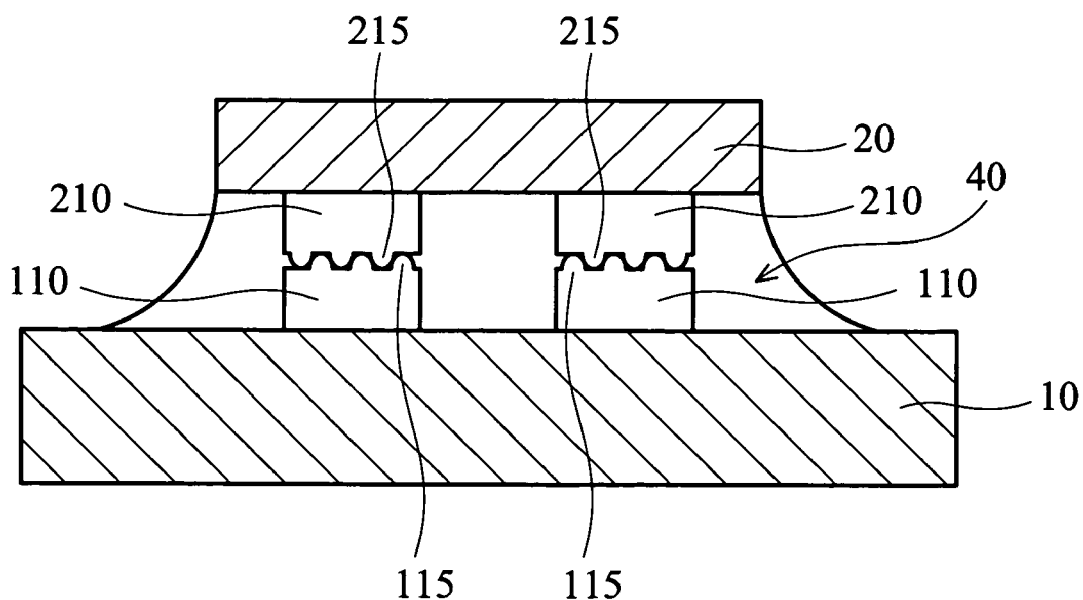
FIG. 5 is a schematic view of the fourth embodiment of the present invention of the IC assembly.

In FIG. 5, the IC assembly comprises an IC chip (first substrate) 20 as shown in FIG. 2, an insulating substrate (second substrate) 10 and an adhesive film 40. The IC chip 20 comprises a plurality of bumps 210, and each bump 210 comprises a patterned pressing surface with a plurality of semi-sphere-shaped metal protrusions 215 disposed thereon as first conductive patterns. The insulating substrate 10 comprises a glass and a plastic, comprises a plurality of electrode pads 110 corresponding to the bumps 210, and each electrode pad 110 disposed on a second surface of the insulating substrate 10 comprises a plurality of metal protrusions 115 disposed thereon as second conductive patterns. The metal protrusions 215 on the patterned pressing surface and the metal protrusions 115 on the electrode pad 110 interlaced each other.

When each electrode pad 110 is pressed on the patterned pressing surface of each bump 210, the metal protrusions 215 on the patterned pressing surface are in contact with the electrode pad 110, and the metal protrusions 115 on the electrode pad 110 are in contact with the patterned pressing surface. Thus, the bumps 210 and the electrode pads 110 are electrically connected to the metal protrusions 115 and 215.

Further, the adhesive film 40 is disposed between the IC chip 20 and the insulating substrate 10 for covering the bumps 210 and the electrode pads 110 and mounting the IC chips 20 and the insulating substrate 10. Since electrical connection is established by the metal protrusions 115 and 215, the adhesive film 40 can be an adhesive layer without conductive particles therein.

Fifth Embodiment

The fifth embodiment of an IC assembly is described hereinafter with reference to FIG. 6.

Figure 6:
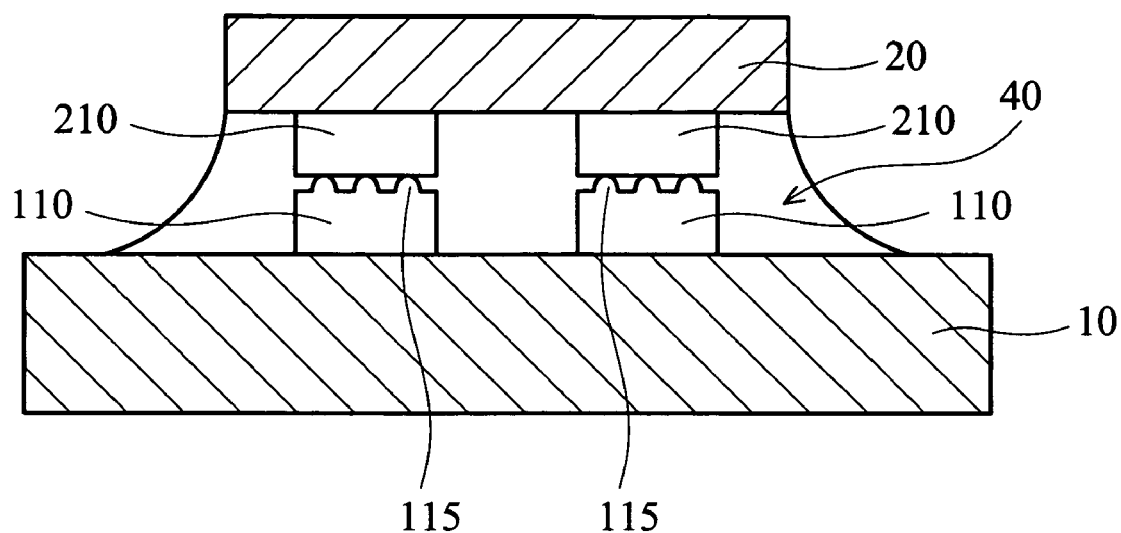
FIG. 6 is a schematic view of the fifth embodiment of the present invention of the IC assembly.

In FIG. 6, the IC assembly comprises an IC chip (first substrate) 20, an insulating substrate (second substrate) 10 and an adhesive film 40. The IC chip 20 comprises a plurality of bumps 210, and each bump 210 comprises a patterned pressing surface. However, there are no metal protrusions 215 disposed on the patterned pressing surface. The insulating substrate 10 comprises a plurality of electrode pads 110 corresponding to the bumps 210, and each electrode pad 110 disposed on a second surface of the insulating substrate 10 comprises a plurality of metal protrusions 115 disposed thereon as conductive patterns.

When each electrode pad 110 is pressed on the patterned pressing surface of each bump 210, the metal protrusions 115 on the electrode pad 110 electrically connected the bump 210 to the electrode pad 110. Thus, the bumps 210 and the electrode pads 110 are electrically connected to the metal protrusions 115.

Further, the adhesive film 40 is disposed between the IC chip 20 and the insulating substrate 10 for covering the bumps 210 and the electrode pads 110 and mounting the IC chips 20 and the insulating substrate 10. Since electrical connection is established by the metal protrusions 115, the adhesive film 40 can be an adhesive layer without conductive particles therein.

Sixth Embodiment

The sixth embodiment of an IC assembly is described hereinafter with reference to FIG. 7.

Figure 7:
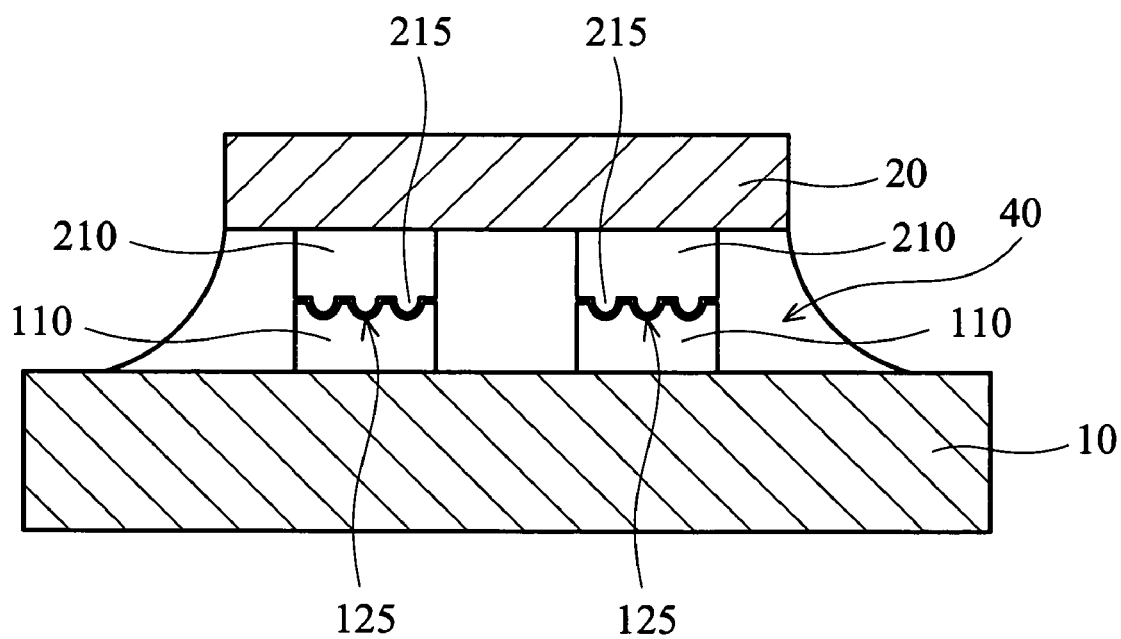
FIG. 7 is a schematic view of the sixth embodiment of the present invention of the IC assembly.

In FIG. 7, the IC assembly comprises an IC chip (first substrate) 20 as shown in FIG. 2, an insulating substrate (second substrate) 10 and an adhesive film 40. The IC chip 20 comprises a plurality of bumps 210, and each bump 210 comprises a patterned pressing surface with a plurality of semi-sphere-shaped metal protrusions 215 disposed thereon as first conductive patterns. The insulating substrate 10 comprises a glass or a plastic, comprises a plurality of electrode pads 110 corresponding to the bumps 210, and each electrode pad 110 disposed on a second surface of the insulating substrate 10 comprises a plurality of recesses 125 disposed thereon as second conductive patterns. Each recess 125 is corresponding to each metal protrusions 215 on the patterned pressing surface.

When each electrode pad 110 is pressed on the patterned pressing surface of each bump 210, the metal protrusions 215 on the patterned pressing surface and the recesses 125 on the electrode pad 110 are engaged and electrically connected the bump 210 to the electrode pad 110. Thus, the bumps 210 and the electrode pads 110 are electrically connected to the metal protrusions 215 and the recesses 125.

Further, the adhesive film 40 is disposed between the IC chip 20 and the insulating substrate 10 for covering the bumps 210 and the electrode pads 110 and mounting the IC chips 20 and the insulating substrate 10. Since electrical connection is established by the metal protrusions 215 and the recesses 125, the adhesive film 40 can be an adhesive layer without conductive particles therein.

Seventh Embodiment

The seventh embodiment of an IC assembly is described hereinafter with reference to FIG. 8.

Figure 8:
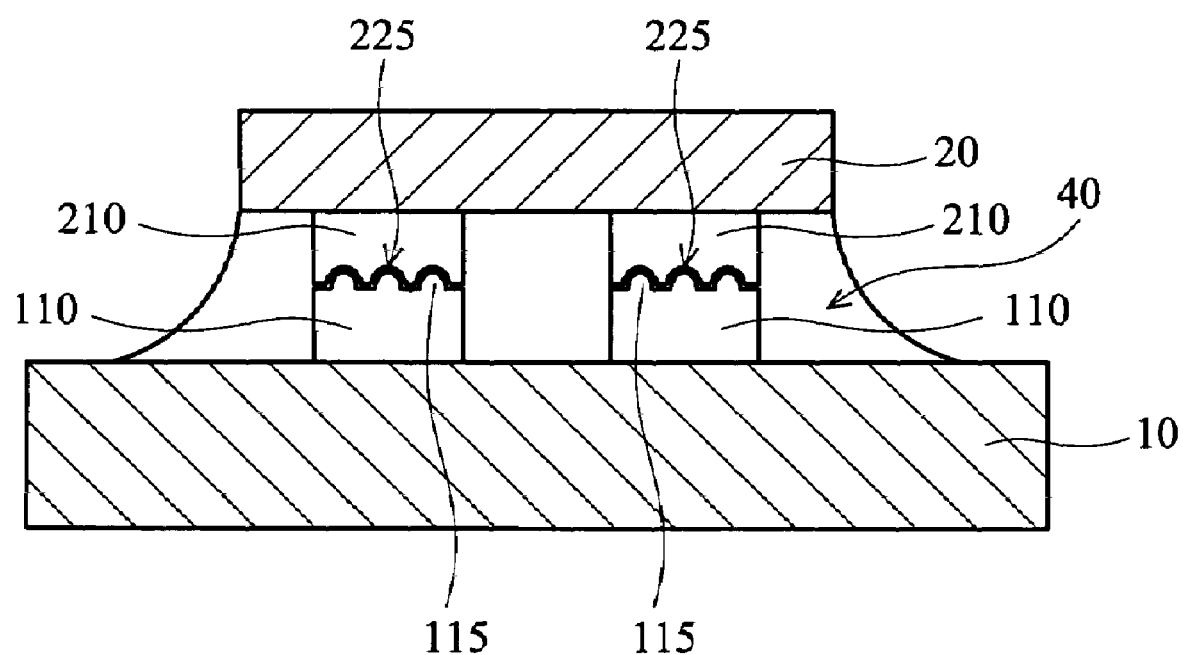
FIG. 8 is a schematic view of the seventh embodiment of the present invention of the IC assembly.

In FIG. 8, the IC assembly comprises an IC chip (first substrate) 20, an insulating substrate (second substrate) 10 and an adhesive film 40. The IC chip 20 comprises a plurality of bumps 210, and each bump 210 comprises a patterned pressing surface. However, there are no metal protrusions 215 disposed on the patterned pressing surface. Instead, a plurality of recesses 225 is disposed on the patterned pressing surface. The insulating substrate 10 comprises a plurality of electrode pads 110 corresponding to the bumps 210, and each electrode pad 110 disposed on a second surface of the insulating substrate 10 comprises a plurality of metal extrusions 115 disposed thereon as conductive patterns.

When each electrode pad 110 is pressed on the patterned pressing surface of each bump 210, the recesses 225 on the patterned pressing surface and the metal protrusions 115 on the electrode pad 110 are engaged and electrically connected the bump 210 to the electrode pad 110. Thus, the bumps 210 and the electrode pads 110 are electrically connected to the metal protrusions 115 and the recesses 225.

Further, the adhesive film 40 is disposed between the IC chip 20 and the insulating substrate 10 for covering the bumps 210 and the electrode pads 110 and mounting the IC chips 20 and the insulating substrate 10. Since electrical connection is established by the metal protrusions 115 and the recesses 225, the adhesive film 40 can be an adhesive layer without conductive particles therein.

It should be noted that in the above-mentioned embodiments, at least one of the patterned pressing surface and the electrode pad 110 comprises a plurality of metal protrusions 115 and/or 215 for electrically connected to the bump 210 and the electrode pad 110. As a result, the adhesive film 40 can be an adhesive layer without conductive particles instead of the ACF, and the cost of the IC assembly is reduced.

Further, the adhesive film 40 can be an adhesive layer without conductive particles. Thus, the electrical connection failure or the short in the conventional COG structure does not occur in the IC assembly, and the distance between the adjacent bumps 210 or the adjacent electrode pads 110 is not hereafter limited.

The metal protrusions 115 and/or 215 are formed on the patterned pressing surfaces and/or the electrode pad 110 and can be fabricated by semiconductor manufacturing process or other preferred process. The shape of the metal protrusions 115 and/or 215 is not limited in the above-mentioned sphere. Preferably, the metal protrusions 115 and/or 215 can be uniformly distributed under control of the manufacturing process, ensuring stability of the electrical connection.

The first conductive patterns and the second conductive patterns are metal protrusions or recesses corresponding thereto, and in sphere or other shapes. The diameter of the semi-sphere-shaped metal protrusions is in a range about 3 to about 15 micrometers.

The IC assembly can be utilized in any device or structure with IC assembly. For example, the IC assembly can be utilized as the driving IC in the flat panel displays, such as LCDs or PDPs. In this case, the insulating substrate of the IC assembly serves as the display panel in the flat panel displays.

While the invention has been described by way of example and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC) package, comprising:
a chip body with a first surface; and
a plurality of bumps formed on the first surface, each bump having a patterned pressing surface comprising a substantially semi-sphere-shaped structure having a diameter in a range of about 3 to about 15 micrometer.

2. An integrated circuit (IC) assembly, comprising:
a first substrate;
an integrated circuit package bonded with the first substrate, comprising:
a chip body with a first surface; and
a plurality of bumps disposed on the first surface, and each bump having a patterned pressing surface;
an second substrate;
a plurality of electrode pads disposed on the second surface of the second substrate corresponding to the bumps, each electrode pad having a plurality of patterns corresponding to the patterned pressing surface; and
an adhesive film, disposed between the first surface of the chip body and the second substrate, for covering the electrode pads and the bumps.

3. The IC assembly according to claim 2, wherein the patterned pressing surface comprises a substantially semi-sphere-shaped structure.

4. The IC assembly according to claim 3, wherein the substantially semi-sphere-shaped structure has a diameter in a range of about 3 to about 15 micrometer.

5. The IC assembly according to claim 2, wherein the second substrate comprises glass or plastic.

6. The IC assembly according to claim 2, wherein the patterns disposed on the second surface of the electrode pads comprise a plurality of recesses.

7. The IC assembly according to claim 2, wherein the patterns disposed on the second surface of the electrode pads comprise a plurality of metal protrusions.

8. An integrated circuit (IC) assembly, comprising:
a first substrate;
an integrated circuit package bonded with the first substrate, comprising:
a chip body with a first surface; and
a plurality of bumps disposed on the first surface, and each bump having a patterned pressing surface;
an second substrate;
a plurality of electrode pads disposed on the second surface of the second substrate corresponding to the bumps, each electrode pad having a plurality patterns so as to engage with the patterned pressing surface; and
an adhesive film, disposed between the first surface of the chip body and the second substrate, for covering the electrode pads and the bumps.

9. The IC assembly according to claim 8, wherein the patterned pressing surface comprises a substantially semi-sphere-shaped structure.

10. The IC assembly according to claim 8, wherein the semi-sphere-shaped structure has a diameter in a range of about 3 to about 15 micrometer.

11. The IC assembly according to claim 8, wherein the second substrate comprises glass or plastic.

12. The IC assembly according to claim 8, wherein the patterns disposed on the second surface of the electrode pads comprise a plurality of recesses.

13. The IC assembly according to claim 8, wherein the patterns disposed on the second surface of the electrode pads comprise a plurality of metal protrusions.

* * * * *